United States Patent
Murakami et al.

(10) Patent No.: US 7,754,613 B2
(45) Date of Patent: Jul. 13, 2010

(54) ETCHING METHOD AND ETCHING APPARATUS

(75) Inventors: Shoichi Murakami, Amagasaki (JP); Takashi Yamamoto, Amagasaki (JP); Tatsuo Hiramura, Amagasaki (JP)

(73) Assignee: Sumitomo Precision Products Co., Ltd., Hyogo (JP)

( * ) Notice: Subject to any disclaimer, the term of this patent is extended or adjusted under 35 U.S.C. 154(b) by 521 days.

(21) Appl. No.: 11/459,646

(22) Filed: Jul. 25, 2006

(65) Prior Publication Data

US 2007/0023394 A1  Feb. 1, 2007

(30) Foreign Application Priority Data

Jul. 27, 2005  (JP)  ............................. 2005-217072

(51) Int. Cl.
  *H01L 21/311* (2006.01)
  *H01L 21/461* (2006.01)
  *H01L 21/302* (2006.01)

(52) U.S. Cl. ................... 438/695; 438/710; 438/714; 438/719; 438/706

(58) Field of Classification Search ................ 438/695, 438/696, 700, 706, 719
  See application file for complete search history.

(56) References Cited

U.S. PATENT DOCUMENTS

| | | | | |
|---|---|---|---|---|
| 6,071,822 | A * | 6/2000 | Donohue et al. | 438/712 |
| 6,743,727 | B2 * | 6/2004 | Mathad et al. | 438/695 |
| 6,759,340 | B2 * | 7/2004 | Nallan et al. | 438/714 |
| 6,780,337 | B2 * | 8/2004 | Goldbach et al. | 216/2 |
| 2005/0087756 | A1 | 4/2005 | Sharaishi | |

FOREIGN PATENT DOCUMENTS

| | | |
|---|---|---|
| JP | H07-503815 A | 4/1995 |
| JP | H11-195641 A | 7/1999 |
| JP | 2003-092286 A | 3/2003 |
| WO | WO-00/62328 | 10/2000 |
| WO | WO-2004/086478 A1 | 10/2004 |
| WO | WO-2004/097909 A2 | 11/2004 |
| WO | WO-2004/112120 A1 | 12/2004 |

OTHER PUBLICATIONS

Shouliang Lai, et al., "Advanced Pressure Control in Time Division Multiplexed (TDM) Plasma Etch Processes," Proceedings of SPIE, 2004, pp. 94-102, vol. 5342, The International Society for Optical Engineering, WA.

* cited by examiner

*Primary Examiner*—Duy-Vu N Deo
(74) *Attorney, Agent, or Firm*—Westerman, Hattori, Daniels & Adrian, LLP.

(57) ABSTRACT

Etching and protective-film deposition operations E and D are in alternation repeatedly executed on a silicon substrate carried on a platform within a processing chamber. With gas inside the processing chamber having been exhausted to pump down the chamber interior, in the etching operation E, the substrate is etched by supplying etching gas into the chamber and converting it into plasma and applying a bias potential to the platform, and in the protective-film deposition operation D, a protective film is formed on the silicon substrate by supplying protective-film deposition gas into the processing chamber and converting it into plasma. When a predetermined time prior to the close of operations E and D (time intervals indicated by reference marks Ee and De) is reached, the supply of etching or protective-film deposition gas is halted, and the exhaust flow rate of gas exhausted from the chamber is made greater than that previously.

5 Claims, 7 Drawing Sheets

*Prior Art*

FIG. 9

Prior Art

FIG. 10

Prior Art

ETCHING METHOD AND ETCHING APPARATUS

BACKGROUND OF THE INVENTION

1. Technical Field

The present invention relates to silicon-substrate etching methods and etching apparatuses structured to execute, repeatedly in alternation, an etching operation in which an etching gas is converted into plasma to etch the silicon substrate, and a protective-film deposition operation in which a protective-film deposition gas is converted into plasma to form a protective film on the silicon substrate.

2. Description of the Related Art

Figure 8:
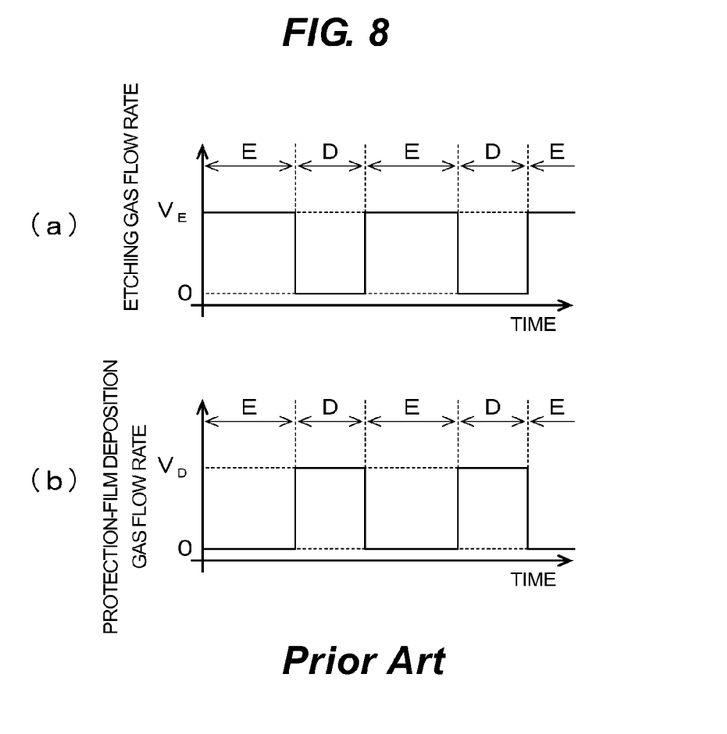
FIG. 8 is a timing chart representing controlled conditions of the supply flow rate of the etching gas and the protective film deposition gas according to a conventional example.

Examples of the above-mentioned etching technique known to date include the method disclosed in Japanese Unexamined Pat. App. (based on Int'l. app.) Pub. No. H07-503815. This etching technique is one in which silicon substrates are etched by placing a silicon substrate on a platform in a processing chamber and then executing repeatedly in alternation, as indicated in FIG. 8: an etching operation E, in which etching gas is supplied into the processing chamber at a constant flow rate and converted into plasma, and at the same time a bias potential is applied to the platform; and a protective-film deposition operation D, in which a protective-film deposition gas is supplied into the processing chamber at a constant flow rate and converted into plasma to form a protective film on the silicon substrate.

In the etching operation E, the etching gas is converted to plasma, generating ions, electrons, radicals, and so on. The silicon substrate is etched by the radicals chemically reacting with the silicon atoms and, as a consequence of the potential difference (bias potential) produced between the platform and the plasma, by the ions traveling toward and colliding with the silicon substrate (platform). Accordingly, in the silicon substrate, which is covered with a photoresist mask of a predetermined pattern (lines, circles, etc.), those areas not covered by the mask are etched, forming grooves and holes provided with predetermined width and depth.

Meanwhile, in the protective-film deposition operation D, the protective-film deposition gas is converted to plasma, and, as is the case with the etching gas, ions, electrons, and radicals are generated. The radicals create polymers, and the polymer formation is deposited on the sidewalls and bottoms of the grooves and holes, whereby a protective film that does not react with the radicals generated by the etching gas is formed.

Thus, according to the etching technique of repeating the etching operation E and the protective-film deposition operation D in alternation: in the etching operation E, along the bottoms of the grooves or holes, where the ion bombardment is heavy, protective film removal by ion bombardment and etching by radical and ion bombardment proceed, and along the sidewalls of the grooves and holes, where the ion bombardment is slight, only protective film removal by ion bombardment proceeds, with etching of the sidewalls being prevented; and in the protective film deposition operation D, polymers are deposited on the bottoms and sidewalls again to form a protective film. Accordingly, the new groove and hole sidewalls formed by the etching operation E are immediately protected by the protective film formed by the protective-film deposition operation D, whereby etching progresses only along the depth of the grooves and holes.

It should be noted that the gases inside the processing chamber are exhausted to the exterior at a constant flow rate by means of a suitable exhaust device; this device reduces the pressure inside the processing chamber, and at the same time discharges outside the processing chamber the etching gas and the protective-film deposition gas consumed in etching the silicon substrate and forming the protective film.

In order to execute the protective-film deposition operation D after execution of the etching operation E, it is necessary to supply the protective-film deposition gas into the processing chamber, to exchange or replace the etching gas in the processing chamber with the protective film deposition gas. Likewise, in order to execute the etching operation E after execution of the protective-film deposition operation D, it is necessary to supply the etching gas into the processing chamber, to exchange or replace the protective film deposition gas in the processing chamber with the etching gas. However, this exchanging of gases requires a certain amount of time.

Consequently, for a certain time following the transition from the etching operation E to the protective-film deposition operation D and following the transition from the protective-film deposition operation D to the etching operation E, the etching gas and the protective-film deposition gas become mixed, and the etching process induced by the etching gas and the protective-film deposition process induced by the protective-film deposition gas proceed simultaneously. As a result, the etching of, and the forming of the protective film on, the silicon substrate that should be carried out by the etching operation E and the protective-film deposition operation D cannot be adequately performed.

Accordingly, several problems occur in situations in which it takes a long time to replace the gases: the etch rate is lowered; high-precision etching profiles cannot be obtained because a high-quality protective film does not form, leading to inadequate protection of the sidewalls; and mask selectivity is lowered because the protective effectiveness of the mask is weakened. These problems are especially pronounced when processing times in the etching operation E and protective-film deposition operation D are short, such that the number of gas replacements is large during a given etching process time, or when the etching operation E and protective-film deposition operation D are performed under high pressure, wherein it takes time to exchange the gases.

Figure 9:
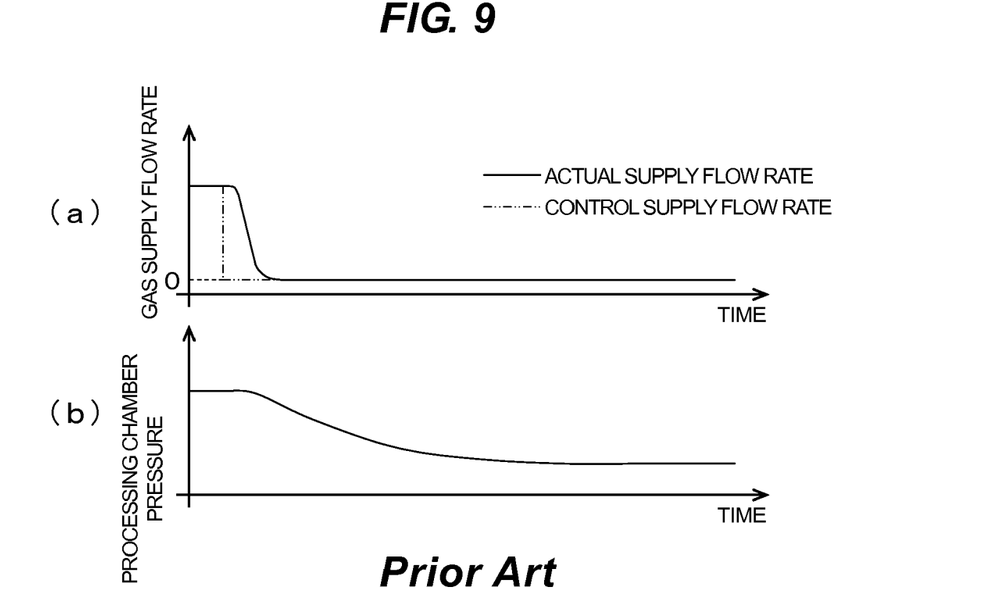
FIG. 9 is a graph representing a relationship between the gas supply flow rate and the time, and a relationship between the pressure in the processing chamber and the time according to the conventional example.
Figure 10:
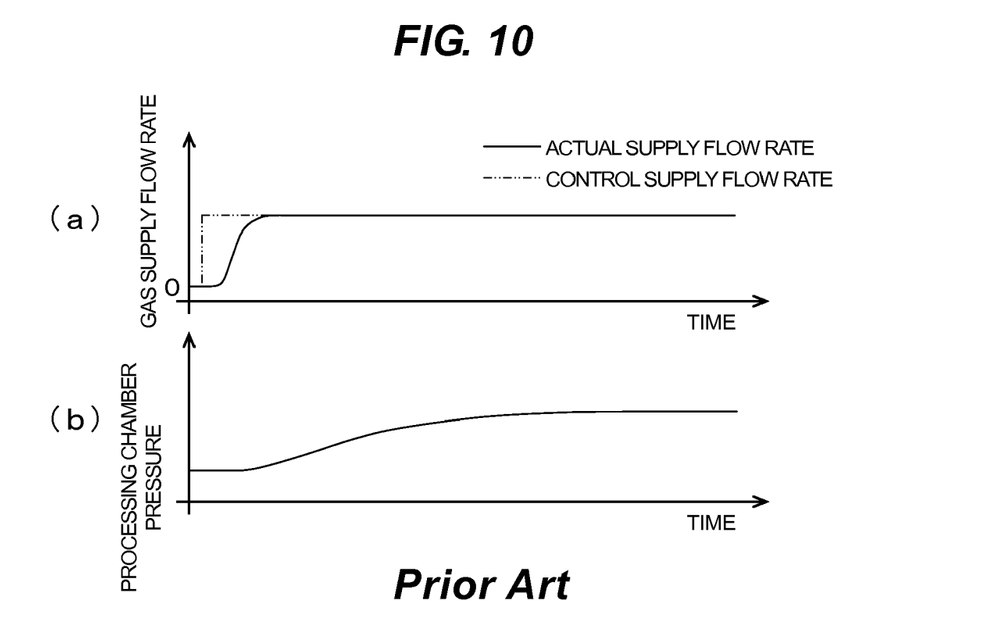
FIG. 10 is a graph representing a relationship between the gas supply flow rate and the time, and a relationship between the pressure in the processing chamber and the time according to the conventional example.

However, in the above-described conventional etching technique, the gases are exchanged by exhausting the gas within the processing chamber at a constant flow rate and at the same time supplying the etching gas or protective-film deposition gas into the processing chamber at a constant flow rate, wherein a problem with the technique has been that time required to exchange the gases is prolonged, as will be understood from the fact that, as indicated in FIG. 9, after the gas supply is halted it takes a long time for the pressure in the processing chamber to stabilize (until the gas in the processing chamber is completely exhausted) and from the fact that, as indicated in FIG. 10, after the gas supply is started it takes a long time for the pressure in the processing chamber to stabilize (until the gas completely fills the processing chamber). Herein, FIG. 9(*a*) and FIG. 10(*a*) are graphs plotting the relationship between gas-supply flow rate and time in a conventional example, while FIG. 9(*b*) and FIG. 10(*b*) are graphs plotting the relationship between pressure within the processing chamber and time in the conventional example.

Furthermore, as a consequence of a time lag, as indicated in FIG. 9(*a*) and FIG. 10(*a*), that occurs between the controlled supply flow rate that is the control target value and the actual supply flow rate, system disturbances arise, such as the continuance of the etching-gas or protective-film-forming-gas supply even after the close of either operation (after transitioning from one operation to the other), and the occurrence of a time interval during which gas supply into the processing chamber immediately after the start of either operation does not take place. These factors also rule out the efficient exchange of gases within the processing chamber.

Consequently, the conventional etching technique discussed above has not allowed the etch rate to be quickened or the mask selectivity to be heightened, nor has it allowed high-precision etching profiles to be obtained.

BRIEF SUMMARY OF THE INVENTION

In light of the above realities, it is an object of the present invention to provide an etching method and an etching apparatus that can efficiently exchange the gases in the processing chamber to speed up the etch rate, improve the mask selectivity, and obtain high-precision etching profiles.

In order to achieve the above mentioned object, the present invention involves a method of etching a silicon substrate placed on a platform in a processing chamber, comprising: an etching operation of etching the silicon substrate by supplying an etching gas into the processing chamber in a state that gas in the processing chamber is exhausted to pump down inside of the processing chamber so that the etching gas is converted to plasma and a bias potential is applied to the base; and a protective-film deposition operation of forming a protective film on the silicon substrate by supplying a protective film deposition gas into the processing chamber in a state that gas in the processing chamber is exhausted to pump down inside of the processing chamber so that the protective film deposition gas is converted to plasma; wherein the etching operation and the protective-film deposition operation are repeated alternately, the supply of the etching gas or the protective film deposition gas is stopped a predetermined time before the end of each step, and an exhaust flow rate for exhausting the gas from the processing chamber is, during a time period from the predetermined time before the end to the end of each step, set higher than an exhaust flow rate before the predetermined time before the end.

This etching method can optimally be implemented with the following etching apparatus.

An etching apparatus comprising: a processing chamber having a closed space; a platform disposed at a lower portion in the processing chamber and on which a silicon substrate is placed; platform power supply means for applying RF power to the base; gas supply means for supplying etching gas and protective film deposition gas into the processing chamber, the gas supply means being configured such that supply flow rates of the etching gas and the protective film deposition gas can be adjusted; a coil being disposed around the processing chamber; coil power supply means for applying RF power to the coil to convert the etching gas and the protective film deposition gas in the processing chamber to plasma; exhaust means for exhausting the gas in the processing chamber to pump down inside of the processing chamber, the exhaust means being configured such that an exhaust flow rate of the gas can be adjusted; and control means for controlling the platform power supply means, the coil power supply means, the gas supply means and the exhaust means; the control means, by controlling the gas supply means to adjust supply flow rates of the etching gas and the protective film deposition gas to be supplied into the processing chamber, alternately repeats an etching operation of supplying the etching gas into the processing chamber to etch the silicon substrate, and a protective-film deposition operation of supplying the protective film deposition gas into the processing chamber to form protective films on the silicon substrate, and the platform power supply means applies RF power to the platform when at least the etching operation is performed, the control means stops the supply of the etching gas or the protective film deposition gas from the gas supply means a predetermined time before the end of each step, and the control means controls the exhaust means to set an exhaust flow rate of the gas exhausted from the processing chamber higher than an exhaust flow rate before the predetermined time, during a time period from the predetermined time before the end to the end of the step. According to this etching apparatus, after the silicon substrate is placed on the platform in the processing chamber, the etching operation of supplying the etching gas into the processing chamber and the protective-film deposition operation of supplying the protective film deposition gas into the processing chamber are repeated alternately to etch the silicon substrate.

More specifically, in the etching operation, under control of the control means, the gas supply means supplies the etching gas into the processing chamber at a constant flow rate, and the coil power supply means and the platform power supply means apply RF power to the coil and the platform, respectively. The inside gas is exhausted by the exhaust means at a constant flow rate, so that the inside of the processing chamber is pumped down to the predetermined pressure.

When RF power is applied to the coil, a magnetic field is generated in the processing chamber. The magnetic field induces an electric field, and the electric field in turn converts the etching gas in the processing chamber to plasma including ions, electrons, and radicals. Meanwhile, when RF power is applied to the platform, a potential difference (bias potential) is generated between the platform and the plasma.

The radicals react chemically with the silicon atoms, and the ions are moved by the bias potential toward the silicon substrate (base) to collide with it. As a result, the silicon substrate that is covered with a mask of resist having a predetermined pattern (lines or circles) is etched only at portions that are not covered with the mask, so that grooves or holes having predetermined width and depth are formed.

Meanwhile, in the protective-film deposition operation, as mentioned before, under control of the control means, the gas supply means supplies the protective film deposition gas at the constant flow rate into the processing chamber, and the coil power supply means applies RF power to the coil. The gas in the processing chamber is exhausted at the constant flow rate by the exhaust means, so that the inside of the processing chamber is pumped down to the predetermined pressure.

The protective film deposition gas supplied into the processing chamber is converted by the electric field to plasma including ions, electrons, and radicals. The polymer is generated from the radicals and is deposited on the sidewalls and bottom surfaces of the grooves or holes. As a result, on the sidewalls and bottom surfaces are generated protective films that do not react with the radicals generated by the etching gas.

As a result, in the etching operation, removing the protective film by the ion bombardment and etching by the radical and ion bombardment are progressed on the bottom surfaces of the grooves or holes because of heavy ion bombardment, and only removing the protective film by the ion bombardment is progressed on the sidewalls of the grooves or holes, i.e., the sidewalls are prevented from being etched because of light ion bombardment. In the protective-film deposition operation, the polymer is deposited again on the bottom surfaces and sidewalls to make protective films so that new sidewalls formed in the etching operation can be protected immediately. Thus, the etching is progressed in the grooves or holes only along the depth.

As described above, since it takes a certain time for exchange (replacement) of the gases in the processing chamber when shifting from the etching operation to the protective-film deposition operation or shifting from the protective-film deposition operation to the etching operation, the etching gas and the protective film deposition gas are mixed until the certain time elapses since the start of each step. Consequently, etching of the silicon substrate or forming of the protective film can not be sufficiently performed, which should be performed in the etching operation or the protective-film deposition operation. Accordingly, if the time of exchanges of the gases becomes long, some problems occur such as lowering of the etch rate, form accuracy of etching, and mask selectivity.

Therefore, in the etching apparatus according to the present invention, the control means controls the gas supply flow rate from the gas supply means and the exhaust flow rate by the exhaust means such that the supply of the etching gas or the protective film deposition gas is stopped the predetermined time before the end of each step, and the exhaust flow rate out of the processing chamber is set higher than that before the predetermined time before the end of each step (than the constant flow rate) during a time period from the predetermined time before the end to the end of the step.

As a result, when shifting from the etching operation to the protective-film deposition operation, the protective film deposition gas is supplied into the processing chamber at the high flow rate during the predetermined time, while exhausting an amount of the etching gas in the processing chamber at the high flow rate. When shifting from the protective-film deposition operation to the etching operation, the etching gas is supplied into the processing chamber at the high flow rate during the predetermined time while exhausting an amount of the protective film deposition gas in the processing chamber at the high flow rate, so that it is possible to efficiently exchange the gases in the processing chamber to achieve an etching gas or protective film deposition gas atmosphere in the processing chamber in a short period of time.

Even if the control means controls the gas supply means to stop the gas supply when shifting the steps, a delay (time lag) occurs from an instant when the gas supply is stopped to an instant when the flow rate of the gas to be supplied into the processing chamber becomes zero in reality. By controlling the control means to stop the gas supply the predetermined time before the end of the each step, it is possible to prevent inconveniences such as supplying the etching gas or the protective film deposition gas continuously after the end of the step (after the step shifting). This contributes to an efficient exchange of the gases in the processing chamber, too.

As a result, it is possible to shorten the time during which the etching gas and the protective film deposition gas are mixed, so that the etching in the etching operation or the forming of the protective film in the protective-film deposition operation can be performed sufficiently to raise the etch rate, and to form the high quality protective films for obtaining the high-precision etching profiles and high mask selectivity.

The control means may control the gas supply means to start to supply the etching gas in advance of the end of the protective-film deposition operation, and to start to supply the protective film deposition gas in advance of the end of the etching operation. A supply flow rate of the etching gas or the protective film deposition gas to be supplied into the processing chamber is, during a time period from the supply start to an instant when a predetermined time elapses since the start of the etching operation or the protective-film deposition operation, set higher than a supply flow rate after the predetermined time elapses (the constant flow rate).

Accordingly, because the etching gas or the protective film deposition gas is supplied into the processing chamber at a high flow rate in advance of the end of the protective-film deposition operation or the etching operation, i.e., during a time period from an instant before the start of the etching operation or the protective-film deposition operation to an instant when the predetermined time elapses since the start of the step, it is possible to efficiently exchange the gases in the processing chamber to make an atmosphere of the etching gas or the protective film deposition gas in a short period of time.

Furthermore, as at the stop of the gas supply, even if the control means controls the gas supply means to start the gas supply, when shifting the steps, a delay (time lag) occurs from an instant when the gas supply is started to an instant when the gas is started to be supplied into the processing chamber at the predetermined flow rate in reality. By starting to supply the etching gas or the protective film deposition gas before the start of the protective-film deposition operation or the etching operation, it is possible to prevent a time period from being generated during which the gas is not supplied into the processing chamber immediately after the start of the step. This contributes to an efficient exchange of the gases in the processing chamber, too.

As a result, as described above, by shortening the time during which the etching gas and the protective film deposition gas are mixed, it is possible to raise the etch rate, and to form high quality protective films to obtain high mask selectivity and high-precision etching profiles.

The control means may control the gas supply means such that a supply flow rate of the etching gas or the protective film deposition gas to be supplied into the processing chamber is, during a time period from the start of each step to an instant when a predetermined time elapses, set higher than a supply flow rate after the predetermined time elapses (the constant flow rate).

In this operation, too, since the etching gas or the protective film deposition gas is supplied at a high flow rate into the processing chamber within the predetermined time after the start of each step, it is possible to efficiently exchange the gases in the processing chamber. i.e., obtaining the same effect as the above-mentioned one.

The present invention is a method for etching a silicon substrate placed on a platform in a processing chamber, comprising: an etching operation of etching the silicon substrate by supplying an etching gas into the processing chamber so that etching gas is converted to plasma and a bias potential is applied to the base; and a protective-film deposition operation of forming a protective film on the silicon substrate by supplying a protective film deposition gas into the processing chamber so that the protective film deposition gas is converted to plasma; wherein the etching operation and the protective-film deposition operation are repeated alternately, a supply flow rate of the etching gas or the protective film deposition gas to be supplied into the processing chamber is, during a time period from the start of the each step to an instant when a predetermined time elapses since the start of each step, set higher than a supply flow rate after the predetermined time elapses.

This etching method can optimally be implemented with the following etching apparatus.

An etching apparatus comprising: a processing chamber having a closed space; a platform disposed at a lower portion in the processing chamber and on which a silicon substrate is placed; platform power supply means for applying RF power to the base; gas supply means for supplying an etching gas and a protective film deposition gas into the processing chamber, the gas supply means being configured such that supply flow rates of the etching gas and the protective film deposition gas can be adjusted; a coil being disposed around the processing chamber; coil power supply means for applying RF power to the coil to convert the etching gas and the protective film deposition gas in the processing chamber to plasma; and control means for controlling the platform power supply means, the coil power supply means and the gas supply means; the control means, by controlling the gas supply means to adjust supply flow rates of the etching gas and the protective film deposition gas to be supplied into the processing chamber, alternately repeats an etching operation of supplying the etching gas into the processing chamber to etch the silicon substrate, and a protective-film deposition operation of supplying the protective film deposition gas into the processing chamber to form a protective film on the silicon substrate, and the platform power supply means applies RF power to the platform when at least the etching operation is performed, the control means controls the gas supply means to, during a time period from the start of each step to an instant when a predetermined time elapses since the start of each step, set a supply flow rate of the etching gas or the protective film deposition gas to be supplied into the processing chamber higher than a supply flow rate after the predetermined time elapses. In this case, too, as mentioned before, in the etching operation, removing the protective film by the ion bombardment and etching by the radical and ion bombardment are progressed on the bottom surfaces of the grooves or holes because of heavy ion bombardment, and only removing the protective film by the ion bombardment is progressed on the sidewalls of the grooves or holes, i.e., the sidewalls are prevented from being etched because of light ion bombardment. In the protective-film deposition operation, the polymer is deposited again on the bottom surfaces and sidewalls to make protective films so that new sidewalls formed in the etching operation can be protected immediately. Thus, the etching is progressed in the grooves or holes only along the depth.

In this etching apparatus, because the control means controls the gas supply means such that the etching gas or the protective film deposition gas is supplied into the processing chamber during a time period from the start of each step to an instant when the predetermined time elapses, it is possible to efficiently exchange the gases, i.e., obtaining the same effect as the above-mentioned one.

In this case too, the control means may control the gas supply means to start to supply the etching gas in advance of the end of the protective-film deposition operation at the flow rate higher than the supply flow rate after the predetermine time elapses in the etching operation, and to start to supply the protective film deposition gas in advance of the end of the etching operation at the flow rate higher than the supply flow rate after the predetermined time elapses in the protective-film deposition operation, thereby obtaining the same effect as the above-mentioned one.

As mentioned above, according to the etching method and the etching apparatus of the present invention, since the gases in the processing chamber can be efficiently exchanged when shifting from the etching operation to the protective-film deposition operation and shifting from the protective-film deposition operation to the etching operation, it is possible to progress the etching in the etching operation and the forming of the protective film in the protective-film deposition operation well. As a result, it is possible to raise the etch rate, improve the mask selectivity and obtain the high-precision etching profiles.

From the following detailed description in conjunction with the accompanying drawings, the foregoing and other objects, features, aspects and advantages of the present invention will become readily apparent to those skilled in the art.

DETAILED DESCRIPTION OF THE INVENTION

Hereinafter, with reference to attached drawings a description will be made of a preferable embodiment of the present invention.

Figure 1:
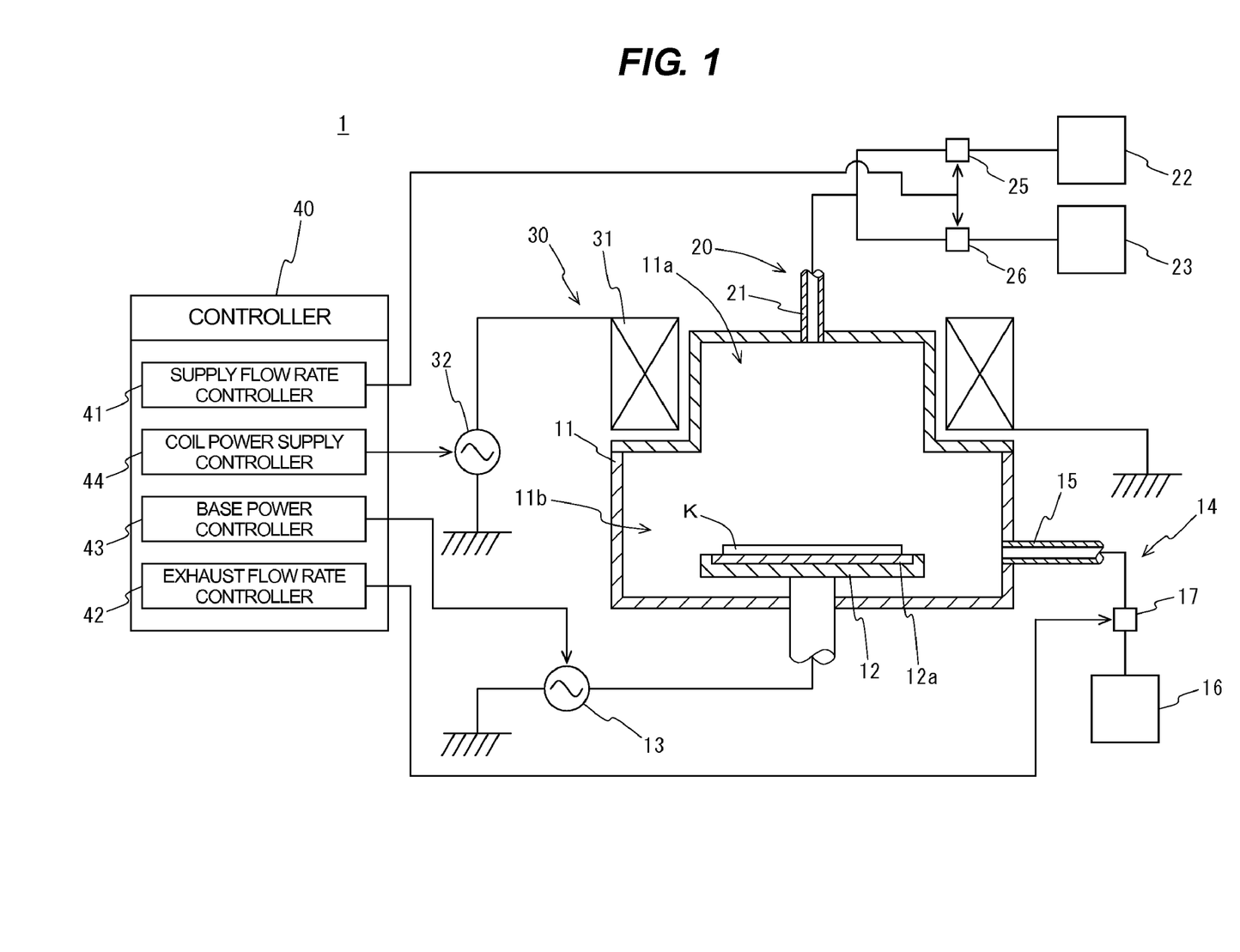
FIG. 1 is a partially block-diagrammed, sectional view illustrating the configurational outline of an etching apparatus involving one embodiment of the present invention.

As shown in FIG. 1, an etching apparatus 1 of the present embodiment comprises a processing chamber 11 having a closed space, a platform 12 displaced on the lower side in the processing chamber 11 and on which a silicon substrate K as a thing to be etched is placed, an exhaust device 14 for exhausting the gas in the processing chamber 11 to pump the inside down, a gas supply device 20 for supplying etching gas and protective film deposition gas into the processing chamber 11, a plasma generating device 30 for converting the etching gas and the protective film deposition gas supplied into the processing chamber 11 to plasma, a first high-frequency power source 13 for applying RF power to the platform 12 to generate a potential difference (bias potential) between the platform 12 and the plasma, and a control device 40 for controlling operations of the exhaust device 14, the gas supply device 20, the plasma generating device 30 and the first high-frequency power source 13.

The processing chamber 11 is made up of a plasma generating chamber 11a and a reaction chamber 11b below the chamber 11a. The platform 12 includes an electrode 12a to which RF power is applied by the first high-frequency power source 13, and is disposed in the reaction chamber 11b.

The exhaust device 14 includes an exhaust pipe 15 connected to a sidewall of the reaction chamber 11b of the processing chamber 11, a vacuum pump 16 connected to the exhaust pipe 15, and a flow rate adjust mechanism 17 for adjusting gas flow rate flowing in the exhaust pipe 15. When the vacuum pump 16 exhausts the gas out of the processing chamber 11, the pressure in the processing chamber 11 is pumped down to a predetermined pressure.

The gas supply device 20 is made up of a supply pipe 21 connected to a ceiling portion of the plasma generating chamber 11a of the processing chamber 11 and gas cylinders 22 and 23 connected to the supply pipe 21 via flow rate adjust mechanisms 25 and 26, respectively. The gases whose flow rates are adjusted by the flow rate adjust mechanisms 25 and 26 are supplied into the plasma generating chamber 11a via the gas cylinders 22 and 23, respectively.

Although $SF_6$ gas for etching is filled in the gas cylinder 22 and $C_4F_8$ gas for forming the protective film is filled in the gas cylinder 23, the etching gas and the protective film deposition gas are not limited to $SF_6$ gas and $C_4F_8$ gas, respectively.

The plasma generating device 30 is made up of a coil 31 disposed around the outer circumference of the plasma generating chamber 11a of the processing chamber 11 and a second high-frequency power source 32 for applying RF power to the coil 31. When the second high-frequency power source 32 applies RF power to the coil 31, a magnetic field is generated in the plasma generating chamber 11a, which induces an electric field to convert the gas in the plasma generating chamber 11a to plasma.

Figure 2:
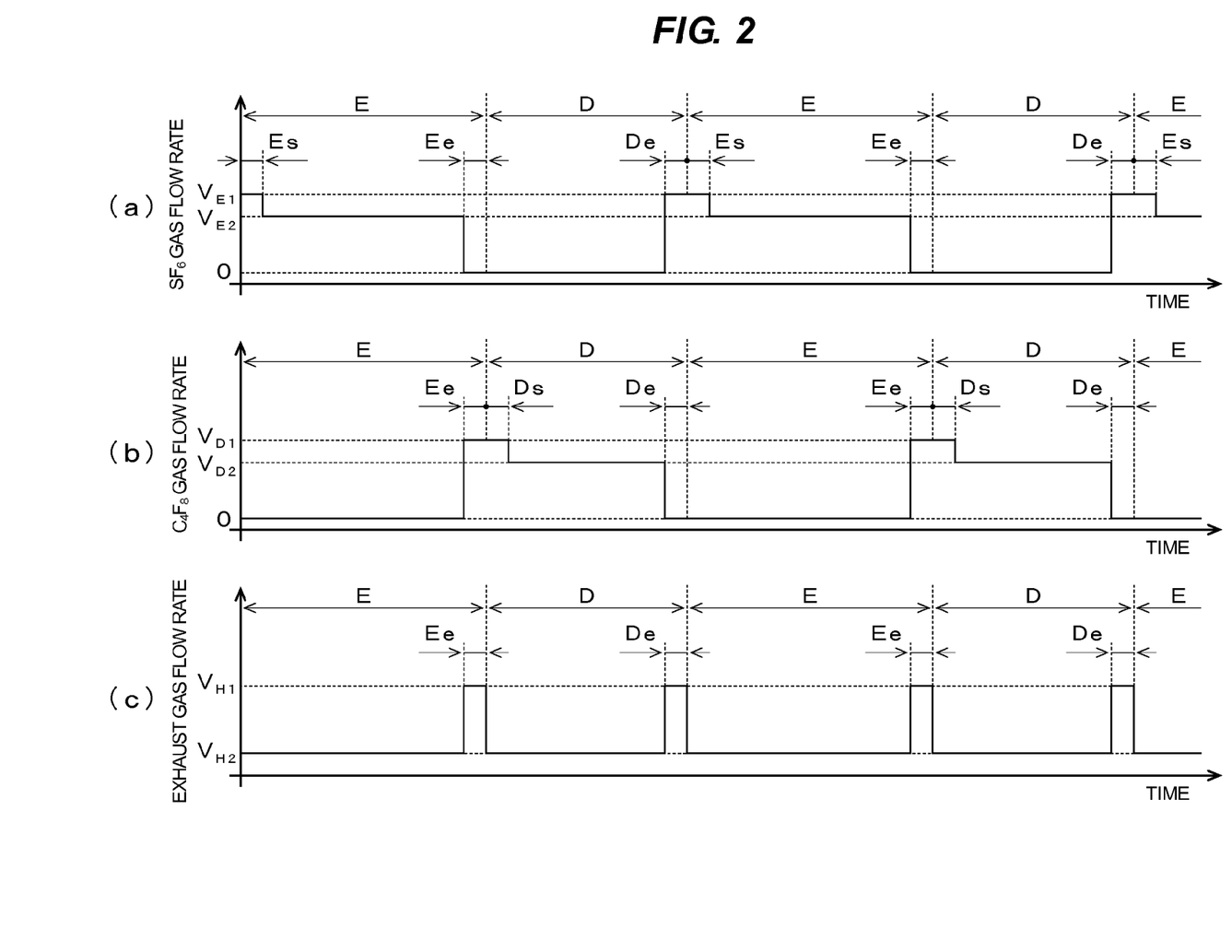
FIG. 2 is a timing chart representing controlled conditions of the supply flow rates of $SF_6$ gas and $C_4F_8$ gas and the gas exhaust flow rates in the processing chamber according to the present invention.
Figure 3:
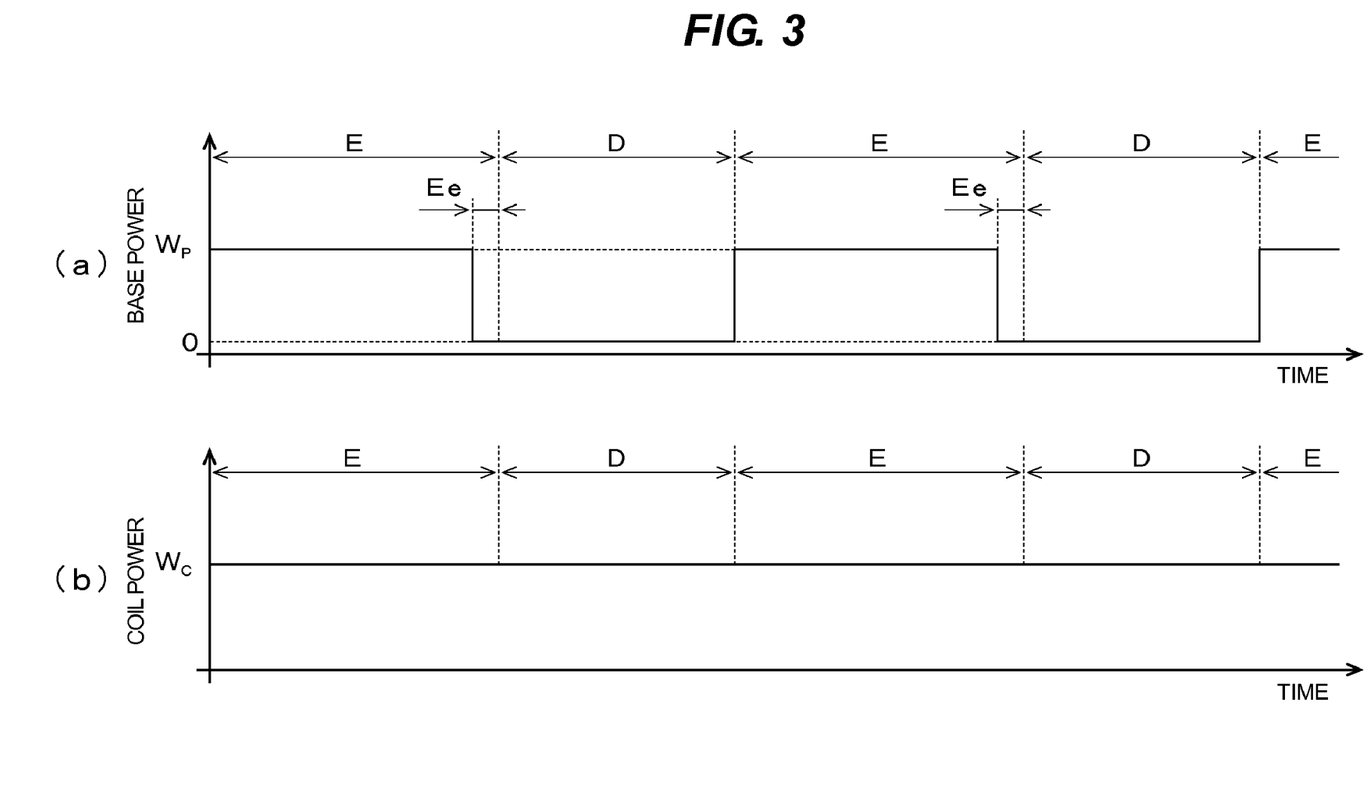
FIG. 3 is a timing chart representing controlled conditions of RF power to be applied to a platform and a coil according to the present invention.

The function of the control device 40 is to repeat etching operations E of etching the silicon substrate K and protective-film deposition operations D of forming protective films on the silicon substrate K alternately for predetermined times, as shown in FIG. 2 and FIG. 3. The control device 40 is made up of a supply flow rate controller 41 for controlling the flow rate adjust mechanisms 25 and 26 to adjust flow rates of $SF_6$ gas and $C_4F_8$ gas to be supplied into the plasma generating chamber 11a of the processing chamber 11 from the gas cylinders 22 and 23, an exhaust flow rate controller 42 for controlling the flow rate adjust mechanism 17 to adjust the flow rate of the gas to be exhausted from the processing chamber 11 by the vacuum pump 16, a platform power controller 43 for controlling the first high-frequency power source 13 to adjust RF power to be applied to the platform 12 (the electrode 12a), and a coil power controller 44 for controlling the second high-frequency power source 32 to adjust RF power to be applied to the coil 31.

The supply flow rate controller 41 changes the flow rates of $SF_6$ gas and $C_4F_8$ gas supplied from the gas cylinder 22 and 23 into the plasma generating chamber 11a as shown in FIG. 2(a) and FIG. 2(b) so that $SF_6$ gas is mainly supplied when the etching operation E is performed and $C_4F_8$ gas is mainly supplied when the protective film deposition operation D is performed.

More specifically, $SF_6$ gas is started to be supplied in advance of the start of the etching operation E, i.e., at an instant when it reaches a predetermined time before the end of the protective film deposition operation D (entering a processing time period indicated by reference mark De). $SF_6$ gas is continued to be supplied until a predetermined time before the end of the etching operation E (until it reaches a processing time period indicated by reference mark Ee). During a time period from the supply start to an instant a predetermined time elapses since the start of the etching operation E (until the end of the processing time period indicated by reference mark Es), $SF_6$ gas is supplied at flow rate $V_{E1}$ higher than flow rate $V_{E2}$ after the predetermined time elapses.

Meanwhile, $C_4F_8$ gas is started to be supplied in advance of the start of the protective film deposition operation D, i.e., when it reaches a predetermined time before the end of the etching operation E (entering the processing time period indicated by reference mark Ee). $C_4F_8$ gas is continued to be supplied until a predetermined time before the end of the protective film deposition operation D (until the processing time period indicated by reference mark De). During a time period from the supply start to an instant when a predetermined time elapses since the start of the protective film deposition operation D (until the end of the processing time period indicated by reference mark Ds), $C_4F_8$ is continued to be supplied at flow rate $V_{D1}$ higher than flow rate $V_{D2}$ after the predetermined time elapses.

The exhaust flow rate controller 42 continuously exhausts the gas in the processing chamber 11 while the etching operation E and the protective film deposition operation D are performed as shown in FIG. 2(c). The exhaust flow rate controller 42 exhausts the gases at flow rate $V_{H1}$ higher than previous flow rate $V_{H2}$ during a time period from a predetermined time before the end of the etching operation E to the end of the etching operation E (the processing time period indicated by reference mark Ee), and a time period from a predetermined time before the end of the protective film deposition operation D to the end of the protective film deposition operation D (the processing time period indicated by reference mark De). The flow rate $V_{H1}$ and the flow rate $V_{H2}$ may be different between performing the etching operation E and performing the protective film deposition operation D.

Figure 4:
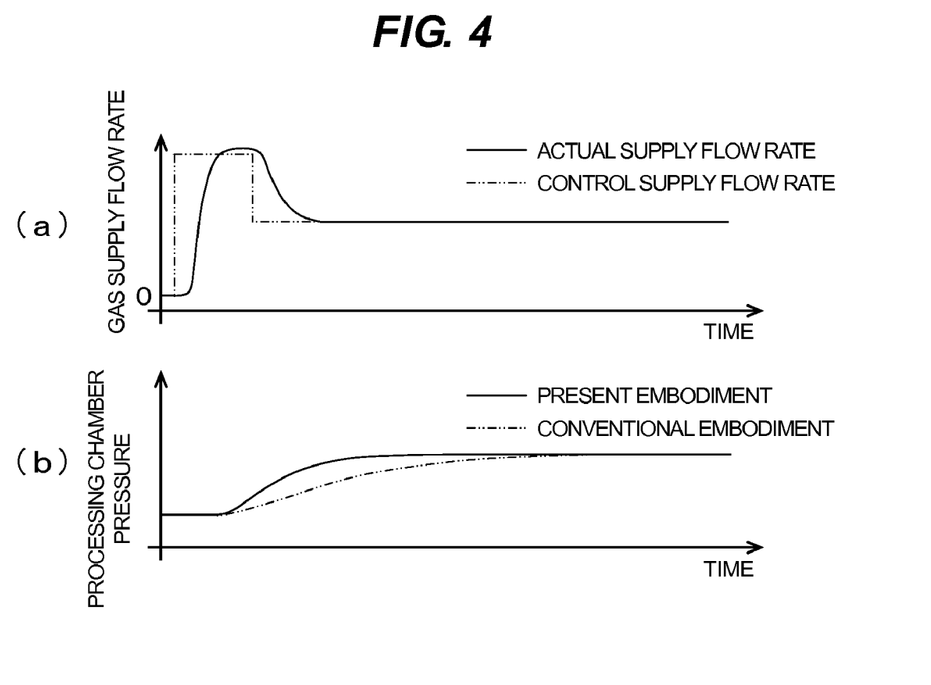
FIG. 4 is a graph representing a relationship between the gas supply flow rate and the time, and a relationship between the pressure in the processing chamber and the time according to the present invention.

The reason why the supply flow rates $V_{E1}$ and $V_{D1}$ are set higher during a time period from the supply start of $SF_6$ gas and $C_4F_8$ gas to the instant the predetermined time elapses since the start of the etching operation E or the protective film deposition operation D is that it is necessary to fill $SF_6$ gas and $C_4F_8$ gas into the processing chamber 11 quickly (to stabilize the pressure in the processing chamber 11 quickly) as shown in FIG. 4. The reason why the exhaust flow rate $V_{H1}$ is set higher the predetermined time before the end of the etching operation E or the protective film deposition operation D is that it is necessary to exhaust the gas in the processing chamber 11 quickly not to leave the gas of the previous step for the next step, as shown in FIG. 5.

Figure 5:
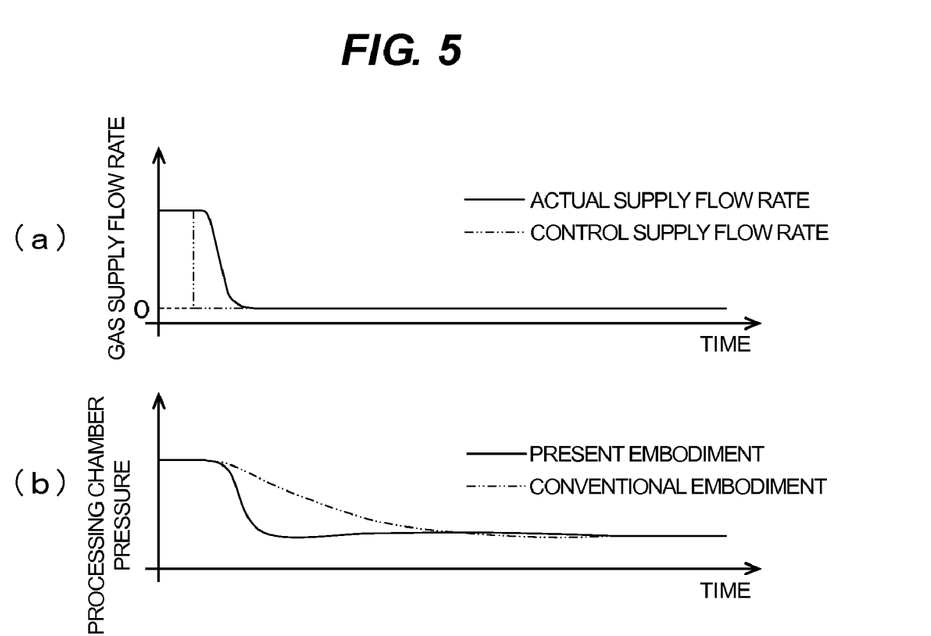
FIG. 5 is a graph representing a relationship between the gas supply flow rate and the time, and a relationship between the pressure in the processing chamber and the time according to the present invention.

The reason why the supply of $SF_6$ gas and $C_4F_8$ gas are started before the starts of the etching operation E and the protective film deposition operation D and are stopped before the ends of the etching operation E and the protective film deposition operation D is that a time delay occurs between a controlled supply flow rate as a control objective value and a real supply flow rate as shown in FIG. 4 and FIG. 5. FIG. 4(a) and FIG. 5(a) are graphs showing a relationship between the gas supply flow rate and the time in the present embodiment. FIG. 4(b) and FIG. 5(b) are graphs showing relationships between the pressure and the time in the processing chamber in the present embodiment and the conventional example.

The platform power controller 43 controls the first high-frequency power source 13 to continuously apply RF power Wp to the platform 12 during a time period from the start of the etching operation E to a predetermined time before the end of the etching operation E (until the processing time period indicated by reference mark Ee) as shown in FIG. 3(a). The coil power controller 44 controls the second high-frequency power source 32 to apply RF power Wc to the coil 31 when the etching operation E and the protective film deposition operation D are performed.

According to the etching apparatus 1 having the above-described configuration in the present embodiment, after the silicon substrate K is placed on the platform 12 in the reaction chamber 11b, the etching operation E and the protective film deposition operation D are repeated alternately to etch the silicon substrate K.

More specifically, in order to perform the etching operation E, first, under control of the control device 40, $SF_6$ gas which is adjusted by the flow rate adjust mechanism 25 to have flow rate $V_{E1}$ is supplied from the gas cylinder 22 into the plasma generating chamber 11a and certain RF power is applied by the high-frequency power sources 13 and 32 to the platform 12 and the coil 31, respectively. The gas which is adjusted by the flow rate adjust mechanism 17 to have the flow rate $V_{H2}$ is exhausted from the processing chamber 11 by the vacuum pump 16 under control of the control device 40, so that the inside of the processing chamber 11 is pumped down to a certain pressure.

When the predetermined time elapses since the start of the etching operation E, i.e., the processing time period indicated by reference mark Es is finished, the flow rate of $SF_6$ gas is lowered to flow rate $V_{E2}$ and $SF_6$ gas is supplied. After that, the supply of $SF_6$ gas and application of RF power to the platform 12 are stopped and the gas in the processing chamber 11 is exhausted at flow rate $V_{H1}$ which heightened compared to the previous one at the predetermined time before the end of the etching operation E (entering the processing time period indicated by reference mark Ee).

At this time, in order to shift steps from the etching operation E to the protective film deposition operation D, $C_4F_8$ gas which is adjusted by the flow rate adjust mechanism 26 to have flow rate $V_{D1}$ is supplied from the gas cylinder 23 into the plasma generating chamber 11a, in advance of the start of the protective film deposition operation D, under control of the control device 40.

When shifting from the etching operation E to the protective film deposition operation D, the gas in the processing chamber 11 is exhausted at flow rate $V_{H2}$ which is lowered compared to the previous one and the inside of the processing chamber 11 is pumped down to a certain pressure. When a predetermined time elapses since the start of the protective film deposition operation D and the processing time period indicated by reference mark Ds is finished, $C_4F_8$ gas is supplied at flow rate $V_{D2}$ which is lowered compared to the previous one. After that, the supply of $C_4F_8$ gas is stopped and the gas in the processing chamber 11 is exhausted at flow rate $V_{H1}$ which is heightened compared to the previous one a predetermined time before the end of the protective film deposition operation D (entering the processing time period indicated by reference mark De).

Furthermore, at this time, in order to shift steps from the protective film deposition operation D to the etching operation E, $SF_6$ gas adjusted to have flow rate $V_{E1}$ is supplied from the gas cylinder 22 to the plasma generating chamber 11a in advance of the start of the etching operation E.

When shifting from the protective film deposition operation D to the etching operation E, the gas in the processing chamber 11 is exhausted at flow rate $V_{H2}$ which is lowered compared to the previous one to pump inside of the processing chamber 11 down to a certain pressure and the high-frequency power source 13 applies certain RF power to the platform 12. After that, when a predetermined time elapses since the start of the etching operation E and the processing time period indicated by reference mark Es is finished, $SF_6$ gas is supplied at flow rate $V_{E2}$ which is lowered compared to the previous one.

Hereinafter, theses processes or operations are subsequently repeated to repeat the etching operations E and the protective-film deposition operations D alternately. In the etching operation E, $SF_6$ gas in the plasma generating chamber 11a is converted to plasma including ions, electrons, and F radicals by an electric field formed by the coil 31, wherein F radicals react chemically with silicon atoms and the ions are moved toward and collide with the platform 12 (the silicon substrate K) by a potential difference (a bias potential) between the platform 12 and the plasma so that the silicon substrate K is etched and grooves or holes are formed in the silicon substrate K patterned by the mask.

Meanwhile, in the protective film deposition operation D, $C_4F_8$ gas in the plasma generating chamber 11a is converted to plasma including ions, electrons, and radicals by the electric field, wherein the radicals form the polymer to be deposited on sidewalls and bottom surfaces of the grooves or holes, so that the protective film (fluorocarbon film) is formed on the sidewalls and bottom surfaces, which does not react with F radicals.

As a result, in the etching operation E, removing the protective film by the ion bombardment and etching by F radical and ion bombardment are progressed on the bottom surfaces of the grooves or holes because of the heavy ion bombardment, and only removing the protective film by the ion bombardment is progressed on the sidewalls of the grooves or holes, i.e., the sidewalls are prevented from being etched because of the light ion bombardment. In the protective film deposition operation D, the polymer is deposited again on the bottom surfaces and sidewalls to make protective films so that new sidewalls formed in the etching operation E can be protected immediately. Thus, the etching is progressed in the grooves or holes only along the depth.

As described above, since it takes a certain time for the exchange (replacement) of the gases in the processing chamber 11 when shifting from the etching operation E to the protective film deposition operation D or shifting from the protective film deposition operation D to the etching operation E, $SF_6$ gas and $C_4F_8$ gas are mixed until the certain time elapses since the start of each operation E and D. Consequently, etching of the silicon substrate K or forming of the protective film on the silicon substrate K can not be sufficiently, which should be performed in the etching operation E or the protective film deposition operation D. Accordingly, if the time of exchanges of the gases becomes long, some problems occur such as lowering the etch rate, form accuracy of etching, and mask selectivity.

Therefore, in the etching apparatus 1 of the present example, the supply of $SF_6$ gas or $C_4F_8$ gas is stopped the predetermined time before the end of the etching operation E or the protective film deposition operation D (entering the processing time periods indicated by reference marks Ee or De). $C_4F_8$ gas or $SF_6$ gas is started to be supplied to perform the next step and is supplied until the predetermined time elapses since the start of the protective film deposition operation D or the etching operation E as next steps (until the end of the processing time periods indicated by reference mark Ds or Es) at the flow rate $V_{D1}$ or $V_{E1}$ higher than the next flow rate $V_{D2}$ or $V_{E2}$. Furthermore, the gas in the processing chamber 11 is exhausted at the flow rate $V_{H1}$ higher than the previous flow rate $V_{H2}$ during a time period from the predetermined time before the end of the etching operation E or the protective film deposition operation D to the end of the etching operation E or protective film deposition operation D (a processing time period indicated by reference mark Ee or De).

As a result, when shifting from the etching operation E to the protective film deposition operation D, $C_4F_8$ gas is supplied into the processing chamber 11 at the high flow rate for a predetermined time, while exhausting $SF_6$ gas in the processing chamber 11 at the high flow rate. When shifting from the protective film deposition operation D to the etching operation E, $SF_6$ gas is supplied into the processing chamber 11 at the high flow rate for the predetermined time while exhausting $C_4F_8$ gas in the processing chamber 11 at the high flow rate, so that it is possible to efficiently exchange gases in the processing chamber 11 to achieve $SF_6$ gas or $C_4F_8$ atmosphere in the processing chamber 11 in a short period of time.

Even if the supply flow rate controller 41 controls the flow rate adjust mechanisms 25 and 26 to stop the gas supply, a delay (time lag) occurs from an instant when the gas supply is stopped to an instant when the flow rate of the gas to be supplied into the processing chamber 11 becomes zero in reality, due to the gases existing in the supply pipe 21 between the flow rate adjust mechanisms 25 and 26 and the plasma generating chamber 11a. By controlling the supply flow rate controller 41 to stop the gas supply the predetermined time before the end of the each operation E and D, it is possible to prevent inconveniences such that $SF_6$ gas or $C_4F_8$ gas is continuously supplied after the end of the operation E or D (after the step shifting). This contributes to an efficient exchange of the gases in the processing chamber 11, too.

Furthermore, as at the stop of the gas supply, even if the supply flow rate controller 41 controls the flow rate adjust mechanisms 25 and 26 to start the gas supply, a delay (time lag) occurs from an instant when the gas supply is started to an instant when the gas is started to be supplied into the processing chamber 11 at the predetermined flow rate in reality, due to a length of the supply pipe 21 from the flow rate adjust mechanisms 25 and 26 to the plasma generating chamber 11a. By starting to supply $SF_6$ gas or $C_4F_8$ gas before each operation E and D, it is possible to prevent a time period during which the gas is not supplied into the processing chamber 11 immediately after the start of the operation E or D. This contributes to an efficient exchange of the gases in the processing chamber 11.

As a result, the time during which $SF_6$ gas and $C_4F_8$ gas are mixed is short so that the etching in the etching operation E and the forming of the protective film in the protective film deposition operation D can be performed well. Furthermore, it is possible to raise the etch rate and to form high quality protective films for obtaining high-precision etching profiles and high mask selectivity.

Although one embodiment of the present invention was described in the above-described description, specific embodiments which can be employed by the present invention are not limited to the embodiment.

Although the supply flow rate controller 41 starts to supply $SF_6$ gas the predetermined time before the end of the protective film deposition operation D and starts to supply $C_4F_8$ gas predetermined time before the end of the etching operation E in the above-described embodiment, operations are not limited to this one. As shown in FIG. 6(a) and FIG. 6(b), $SF_6$ gas and $C_4F_8$ gas may be started to be supplied simultaneously at the start of the etching operation E and protective film deposition operation D and the gases are supplied from the supply start to an instant when the predetermined time elapses (until the end of the processing time period indicated by reference mark Es and Ds) at the flow rates $V_{E1}$ and $V_{D1}$ higher than the flow rates $V_{E2}$ and $V_{D2}$ after the predetermined time elapses, respectively. In this case, too, the exhaust flow rate controller 42 controls the exhaust flow rate of the gas in the processing chamber 11 as described above, as shown in FIG. 6(c).

In this case, due to $SF_6$ gas or $C_4F_8$ gas having a high flow rate to be supplied into the processing chamber 11 within the predetermined time after the start of each operation D and E, it is possible to efficiently exchange the gases in the processing chamber 11 and making $SF_6$ gas or $C_4F_8$ gas atmosphere in the processing chamber 11 in a short period of time, thereby achieving the same effect as one in the above-described embodiment.

Although the time to stop the supply of $SF_6$ gas and the time to start the supply of $C_4F_8$ gas are set to be the same as the time to stop the supply of $C_4F_8$ gas and the time to stop the supply of $SF_6$ gas, respectively, in the above-described embodiment, they can be set as different from each other. In addition, the processing times of the etching operation E and the protective film deposition operation D, the processing times indicated by reference mark Es and reference mark Ds, and the processing times indicated by reference mark Ee and reference mark De may be the same as each other or different from each other.

Figure 7:
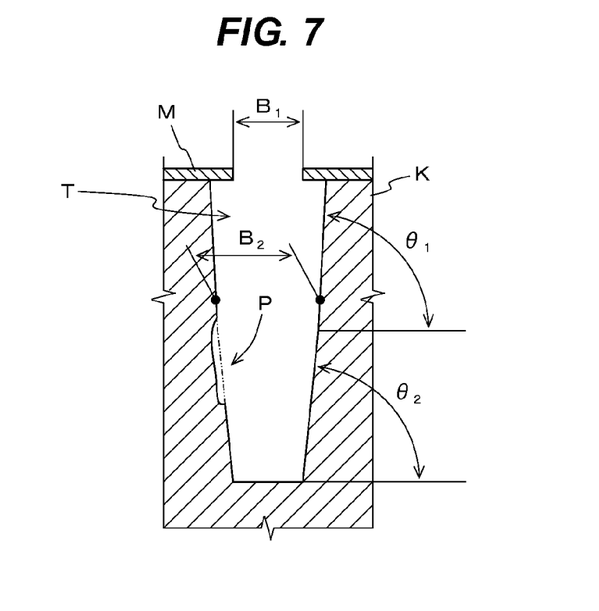
FIG. 7 is an illustrative picture for explaining the cross-sectional shape of the silicon substrate.

In embodiment example 1, conditions were as follows. In the etching operation E, the overall processing time was 4.3 seconds, the processing time indicated by reference mark Es was 0.4 seconds, the processing time indicated by reference mark Ee was 0.3 seconds, the pressure in the processing chamber 11 was 13 Pa, RF power applied to the coil 31 was 2.5 kW, RF power applied to the platform 12 was 170 W, the supply flow rate of $SF_6$ gas indicated by reference mark Es was 600 ml/min, the supply flow rate of $SF_6$ gas indicated between reference mark Es and reference mark Ee was 400 ml/min, the supply flow rate of $C_4F_8$ gas indicated by reference mark Ee was 400 ml/min, the degree of opening of the exhaust valve constituting the flow rate adjust mechanism 17 was 8% except for reference mark Ee, and the degree of opening of the exhaust valve in the reference mark Ee was 30%. In the protective film deposition operation D, the whole processing time was 3.3 seconds, the processing time indicated by reference mark Ds was 0.4 seconds, the processing time indicated by reference mark De was 0.3 seconds, the pressure in the processing chamber 11 was 8 Pa, RF power to be applied to the coil 31 was 2.5 kW, RF power to be applied to the platform 12 was 0 W, the supply flow rate of $C_4F_8$ gas indicated by reference mark Ds was 400 ml/min, the supply flow rate $C_4F_8$ gas between reference mark Ds and reference mark De was 200 ml/min, the supply flow rate of $SF_6$ gas indicated by reference mark De was 600 ml/min, the degree of opening of the exhaust valve except for reference mark De was 8%, the degree of opening of the exhaust valve in reference mark De was 30%. The silicon substrate K was etched for a predetermined time as shown in FIG. 2, wherein opening width $B_1$ of the mask M was 2 μm shown in FIG. 7. As a result, the etch rate was 4.94 μm/min, the mask selectivity was 57, the maximum value of the groove width $B_2$ was 2.55 μm, an upper portion etched angle $\theta_1$ was 89.8°, and a lower portion etched angle $\theta_2$ was 89.7°. As a result, perpendicular etched sidewalls were obtained, i.e., there was no etched shape of the sidewall whose sidewall protective film was damaged as shown in FIG. 7. As shown in FIG. 7, the lower portion etched angle $\theta_2$ is an angle between the bottom surface and the sidewall of the groove or hole T, and the upper portion etched angle $\theta_1$ is an angle between a surface in parallel with the bottom surface and the sidewall of the groove or hole T in the middle along the depth.

Figure 6:
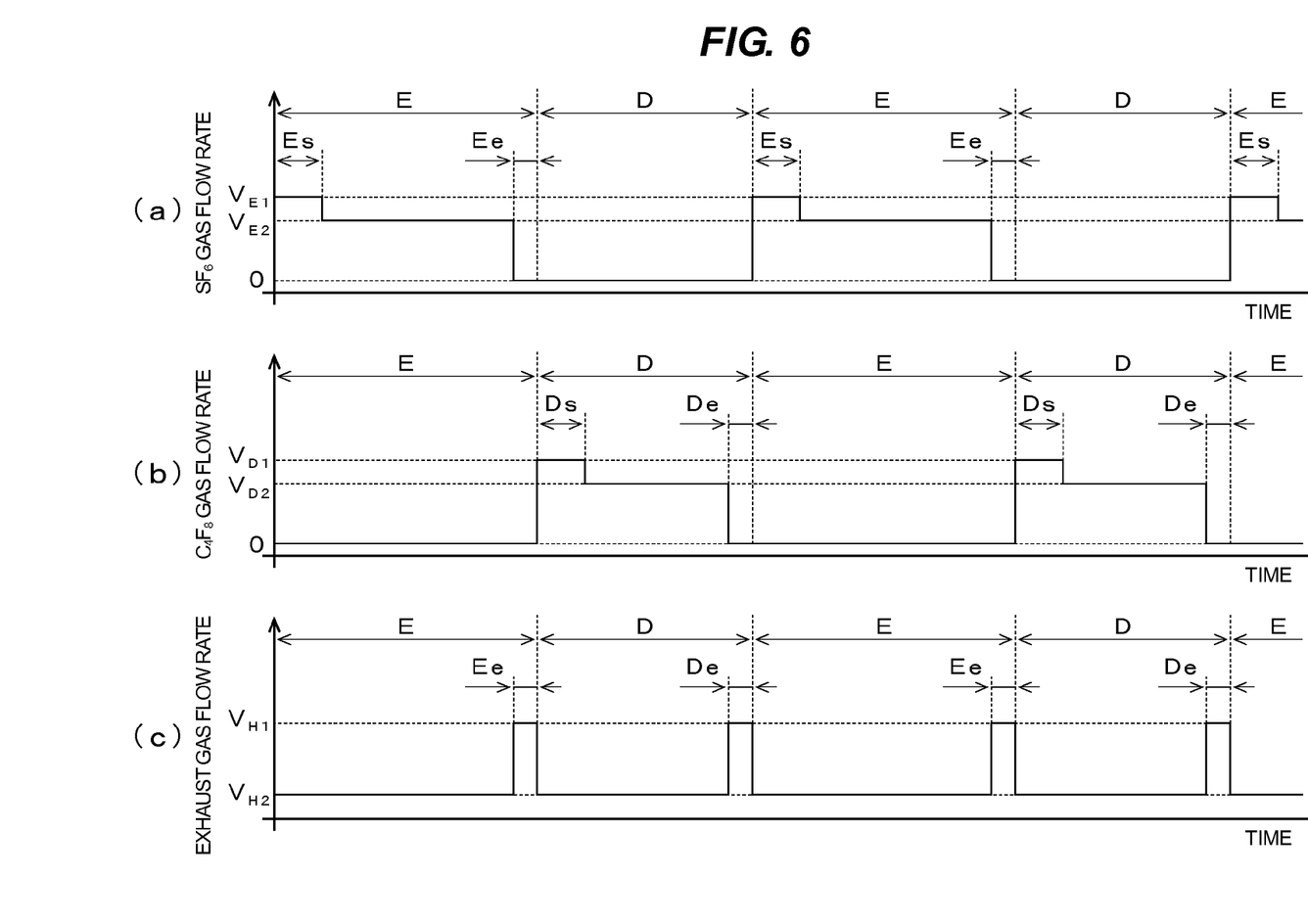
FIG. 6 is a timing chart representing controlled conditions of the supply flow rates of $SF_6$ gas and $C_4F_8$ gas and the gas exhaust flow rates in the processing chamber in another embodiment according to the present invention.

In embodiment example 2, conditions were as follows. In the etching operation E, the whole processing time was 4 seconds, the processing time indicated by reference mark Es was 0.7 seconds, the processing time indicated by reference mark Ee was 0.3 seconds, the pressure in the processing chamber 11 was 13 Pa, RF power to be applied to the coil 31 was 2.5 kW, RF power to be applied to the platform 12 was 170 W, the supply flow rate of $SF_6$ gas indicated by reference mark Es was 600 ml/min, the supply flow rate of $SF_6$ gas between reference mark Es and reference mark Ee was 400 ml/min, the degree of opening of the exhaust valve except for reference mark Ee was 8%, the degree of opening of the exhaust valve in reference mark Ee was 30%. In the protective film deposition operation D, the whole process time was 3 seconds, the processing time indicated by reference mark Ds was 0.7 seconds, the processing time indicated by reference mark De was 0.3 seconds, the pressure in the processing chamber 11 was 8 Pa, RF power to be applied to the coil 31 was 2.5 kW, RF power to be applied to the platform 12 was 0 W, the supply flow rate of $C_4F_8$ gas indicated by reference mark Ds was 400 ml/min, the supply flow rate of $C_4F_8$ gas between reference mark Ds and reference mark De was 200 ml/min, the degree of opening of the exhaust valve except for reference mark De was 8%, and the degree of opening the exhaust valve in reference mark De was 30%. The silicon substrate K was etched for a predetermined time as shown in FIG. 6, wherein opening width $B_1$ of the mask M was 2 μm as shown in FIG. 7, the etch rate was 5.08 μm/min, the mask selectivity was 68, the maximum value of the groove width $B_2$ was 2.22 μm, the upper portion etched angle $\theta_1$ was 89.7°, the lower portion etched angle $\theta_2$ was 89.1°. As a result, forward tapered etching shape was obtained, i.e., there was no etched shape P of the sidewall whose sidewall protective film was damaged as shown in FIG. 7.

In contrast, as a comparison example, conditions were as follows. In the etching operation E, the processing time was 4 seconds, the pressure in the processing chamber 11 was 13 Pa, RF power to be applied to the coil 31 was 2.5 kW, RF power to be applied to the platform 12 was 170 W, the supply flow rate of $SF_6$ gas was 400 ml/min, the degree of opening of the exhaust valve was 8%. In the protective film deposition operation D, the processing time was 3 seconds, the pressure in the processing chamber 11 was 8 Pa, RF power to be applied to the coil 31 was 2.5 kW, RF power to be applied to the platform 12 was 0 W, the supply flow rate of $C_4F_8$ gas was 200 ml/min, the degree of opening of the exhaust valve was 8%. The silicon substrate K whose mask M had opening width $B_1$ of 2 μm as shown in FIG. 7 was etched for a predetermined time as shown in FIG. 8, wherein the etch rate was 4.46 μm/min, the mask selectivity was 48, the maximum value of the groove width $B_2$ was 3.11 μm, the upper portion etched angle $\theta_1$ was 90.9°, the lower portion etched angle $\theta_2$ was 89.2°. As a result, the sidewall had etched shape P as shown in FIG. 7 due to damages to the sidewall protective films, and had a bowed profile.

Comparing the embodiment examples 1 and 2 with the comparison example, according to the etching apparatus 1 of the present examples, it is apparent that the etch rate is raised, the mask selectivity is improved, and sidewalls having an etched profile P or bowed profile, as illustrated in FIG. 7, do not arise. By these effects, the conclusion is that the etch rate can be raised, the mask selectivity can be improved, and etching accuracy can be improved with the etching apparatus 1 of the present embodiment.

Only selected embodiments have been chosen to illustrate the present invention. To those skilled in the art, however, it will be apparent from the foregoing disclosure that various changes and modifications can be made herein without departing from the scope of the invention as defined in the appended claims. Furthermore, the foregoing description of the embodiments according to the present invention is provided for illustration only, and not for limiting the invention as defined by the appended claims and their equivalents.

What is claimed is:

1. A method of etching a silicon substrate loaded onto a platform within a processing chamber, the etching method comprising:
   (a) an etching operation of
   in a state in which gas within the processing chamber has been exhausted to pump down the chamber interior, supplying etching gas into the processing chamber and converting the etching gas into plasma, and meanwhile applying a bias potential to the platform, to etch the silicon substrate,
   halting the supply of etching gas when a preestablished time prior to the close of said etching operation is reached, and
   making the exhaust flow rate at which gas is exhausted from inside the processing chamber, from when the preestablished time is passed up until the close of said etching operation, greater than the exhaust flow rate prior to when the preestablished time is passed;
   (b) a protective-film deposition operation of
   in a state in which gas within the processing chamber has been exhausted to pump down the chamber interior supplying protective-film deposition gas into the processing chamber and converting the protective-film deposition gas into plasma, to form a protective film onto the silicon substrate;
   a step of halting the supply of protective-film deposition gas when a preestablished time prior to the close of said protective-film deposition operation is reached,
   making the exhaust flow rate at which gas is exhausted from inside the processing chamber, from when the preestablished time is passed up until the close of said protective-film deposition operation, greater than the exhaust flow rate prior to when the preestablished time is passed; and
   in alternation repeating said operations (a) and (b).

2. The etching method as set forth in claim 1, wherein:
   supply of etching gas is started prior to the close of said protective-film deposition operation, and supply of protective-film deposition gas is started prior to the close of said etching operation; and
   from the start of the supply, until a preestablished time period elapses after commencement of said etching operation or said protective-film deposition operation, the supply flow rate of etching gas or protective-film deposition gas supplied into the processing chamber is made greater than the supply flow rate following elapse of the preestablished time period.

3. The etching method as set forth in claim 1, wherein until a preestablished time period elapses after commencement of said operations (a) and (b), the supply flow rate of etching gas or protective-film deposition gas supplied into the processing chamber is made greater than the supply flow rate following elapse of the preestablished time period.

4. A method of etching a silicon substrate loaded onto a platform within a processing chamber, the etching method comprising:
   (a) an etching operation of supplying etching gas into the processing chamber in a state in which supply of protective-film deposition gas is stopped and converting the etching gas into plasma, and meanwhile applying a bias potential to the platform, to etch the silicon substrate, and supplying etching gas to the processing chamber at a first etching gas supply flow rate for a predetermined time period beginning after commencement of said operation (a), changing the first etching gas supply flow rate to a second etching gas supply flow rate for a time period beginning at an end of the predetermined time period beginning after commencement of said operation (a) and ending at a predetermined time before an end of the etching operation, the first etching gas supply flow rate being greater than the second etching gas supply flow rate;

(b) a protective-film deposition operation of supplying protective-film deposition gas into the processing chamber in a state in which supply of etching gas is stopped and converting the protective-film deposition gas into plasma, to form a protective film onto the silicon substrate, and supplying protective-film deposition gas to the processing chamber at a first protective-film deposition gas supply flow rate for a predetermined time period beginning after commencement of said operation (b), changing the first protective-film deposition gas supply flow rate to a second protective-film deposition gas supply flow rate for a time period beginning at an end of the predetermined time period beginning after commencement of said operation (b) and ending at a predetermined time before an end of the protective-film deposition operation, the first protective-film deposition gas supply flow rate being greater than the second protective-film deposition gas supply flow rate; and in alternation repeating said operations (a) and (b).

5. The etching method as set forth in claim 4, wherein:

etching gas is supplied at a flow rate greater than the supply flow rate following elapse of the predetermined time period beginning after commencement of said operation (a) starting from before the close of said protective-film deposition operation, on the other hand, simultaneously the supply of protective-film deposition gas is stopped; and protective-film deposition gas is supplied at a flow rate greater than the supply flow rate following elapse of the predetermined time period beginning after commencement of said operation (b) starting from before the close of said etching operation, on the other hand, simultaneously the supply of etching gas is stopped.

* * * * *